United States Patent [19]
Robinson

[11] Patent Number: 6,103,638
[45] Date of Patent: Aug. 15, 2000

[54] FORMATION OF PLANAR DIELECTRIC LAYERS USING LIQUID INTERFACES

[75] Inventor: Karl M. Robinson, Boise, Id.

[73] Assignee: Micron Technology, Inc., Boise, Id.

[21] Appl. No.: 08/967,354

[22] Filed: Nov. 7, 1997

[51] Int. Cl.[7] ............................................. H01L 21/469
[52] U.S. Cl. ......................... 438/778; 438/631; 438/787; 438/799; 438/615
[58] Field of Search .................................... 438/631, 778, 438/787, 791, 799, 780, 645, 760; 427/431, 435

[56] References Cited

U.S. PATENT DOCUMENTS 5,434,107  7/1995  Paranjpe ................................. 437/225

OTHER PUBLICATIONS

Wolf, Stanley. "Silicon Processing For The VLSI Era", vol. 2 : Profess Integration, USPTO Scientific Library, pp. 200, 223, 1990.

*Primary Examiner*—Matthew Smith
*Assistant Examiner*—Renzo Rocchegiani
*Attorney, Agent, or Firm*—Dorsey & Whitney LLP

[57] ABSTRACT

A method and apparatus for forming a planar layer on a surface of a microelectronic substrate. The method comprises controlling a temperature of a liquid support material to be at least an annealing temperature of material comprising the planar layer. In one embodiment, the planar layer material has a lower density than the liquid support material and the method further comprises floating the planar layer material upon the liquid support material so that the planar layer material attains a temperature of at least its annealing temperature. The planar layer material forms a planar surface at an interface with the support material and is adhered at an opposite surface to the substrate to form a planar layer thereon. In another embodiment, the planar layer material is adhered to a surface of the substrate. The planar layer material is then engaged with the liquid support material so that the planar layer material attains a temperature of at least its annealing temperature, forming a planar surface at an interface with the liquid support material.

58 Claims, 6 Drawing Sheets

FORMATION OF PLANAR DIELECTRIC LAYERS USING LIQUID INTERFACES

TECHNICAL FIELD

The present invention relates to a method and apparatus for forming a planar dielectric layer on a substrate using a liquid interface.

BACKGROUND OF THE INVENTION

Complex microelectronic components have several levels of semiconductor structures positioned above one another. Dielectric layers interposed between the levels insulate structures on one level from structures on an adjacent level. The structures are accordingly sandwiched between the dielectric layers. Structures on different levels may then be selectively coupled with conductive lines extending through the intermediate dielectric layers between the structures.

The dielectric layers between each level must be extremely thin to minimize the overall thickness of the microelectronic component. The dielectric layers must also be extremely flat to enable precise circuit patterns and structures to be formed in the layers using photolithography and photo pattern techniques. As the density of the structures within the microelectronic component increases, it is often necessary to accurately focus the critical dimensions of the photo patterns to within a tolerance of approximately 1 $\mu$m. Focusing the photo patterns to such small tolerances, however, is difficult when the surface of the dielectric layer is not uniformly planar.

Current methods for flattening the surface of dielectric layers or other substrates include chemical mechanical planarization (CMP) processes which chemically and/or mechanically remove material from the dielectric layer. One problem with current CMP processes is that they are extremely time consuming and therefore increase the overall time required to manufacture the microelectronic components. Another problem with current CMP processes is that a trial-and-error end-pointing technique is used to determine when a sufficient amount of material has been removed from the dielectric layer. The trial-and-error technique is time consuming and may not accurately determine when the proper amount of material has been removed. If an insufficient amount of material is removed, the layer may be too thick and/or may not be sufficiently flat. If an excessive amount of material is removed, the structures beneath the dielectric layer may be damaged.

A further problem with current CMP techniques is that the planarizing rate may vary across the surface of the dielectric, reducing the uniformity of the planarized surface and therefore the ability to uniformly focus photo patterns on the surface to small tolerances. As the microelectronic components are made smaller, the photo patterns must be focused to smaller tolerances and the effects of surface non-planarity accordingly increase.

Yet a further problem with current CMP processes is that the processes produce debris, such as particulates removed from the dielectric material and particulates incidentally removed from the planarizing device as it abrades the dielectric material. The particulates may contaminate or otherwise damage the microelectronic component.

CMP processes are further disadvantageous because they require post-processing steps, such as rapid temperature processing (RTP) and densification to purify and consolidate the planarized layer. The steps are not only time consuming, but also heat the microelectronic component. Because each component has a limited thermal budget and can therefore withstand only a limited amount of heat before failing, the post-processing steps increase the likelihood that the component may fail and limit the amount of heat to which the component may be subjected during other phases of production.

Another problem with current CMP processes is that they require the dielectric layers to be formed on the microelectronic component before the layers are planarized. Current methods for forming the dielectric layers include depositing the layers upon the structures of the microelectronic component using a variety of deposition techniques. However, as the structures are made increasingly non-uniform and the components themselves are made smaller, the dielectric layers may not conform well to the structures. As a result, the layers may break or become discontinuous, allowing structures on different levels of the component to inadvertently come into electrical contact with each other. Thus, current methods for forming the dielectric layers are inadequate.

Current methods for flattening the surface of a dielectric layer also include subjecting the dielectric layer to high pressure, as disclosed by U.S. Pat. No. 5,434,107 to Paranjpe. Paranjpe discloses filling the submicron spaces of a semiconductor wafer with an interlevel dielectric material to locally planarize the wafer. The wafer is then coated with a film of deformable material, such as a low melting point metal or alloy, spun on glass, a suitable resin or a reflowable glass. The deformable film is squeezed under high pressure to form a flat surface, and then cured by raising the temperature of the film. The film may be squeezed by either pressing the film against a flat plate or by disposing a high pressure fluid between a flat plate and the film. Where the film is compressed by a high pressure fluid, the fluid is pressurized between a movable chuck which supports the wafer and dielectric layer, and a movable piston.

One disadvantage with the high pressure method discussed above is that it requires that both an interlevel dielectric material and a deformable film be placed on the semiconductor wafer to form a planar surface thereon. The two-step process increases the amount of time and material cost required to produce a planar dielectric layer. A further disadvantage is that the apparatus discussed above incorporates a plurality of moving parts which may be subject to wear and possibly failure due to the high pressure conditions under which they operate.

SUMMARY OF THE INVENTION

The present invention is directed, in part, toward a method and apparatus for forming a planar layer on a surface of a microelectronic substrate. In one embodiment, a planar layer is provided, the planar layer having a first surface facing the microelectronic substrate and a second, substantially planar surface opposite the first. The first surface is then adhered directly to the substrate. In another embodiment, material comprising the planar layer floats upon a liquid support material having a density greater than a density of the planar layer material and a temperature of at least an annealing temperature of the planar layer. The planar layer material attains a temperature of at least its annealing temperature and flows, forming the planar surface at an interface with the support material. The substrate is then brought into contact with the planar layer material and bonded thereto.

In another embodiment, planar layer material is first adhered directly to the substrate to form a layer having a first surface adjacent the substrate and a second surface opposite the first. The second surface is engaged with the liquid support material, which has a temperature of at least the planar layer material annealing temperature and a density different than the density of the planar layer material. The second surface of the planar layer material attains a temperature of at least its annealing temperature and reflows to form a planar surface.

In one embodiment of the invention, the liquid support material and planar layer material are contained in an open-ended vessel. A heating device heats the support material and planar layer material to at least the planar layer material annealing temperature so that the planar layer material forms a flat surface at the interface with the support material. A piston then engages the substrate with the planar layer material and a cooling device cools the planar layer material so that it bonds to the substrate with the flat surface opposite from the substrate. The substrate and planar layer are then removed as a unit from the vessel.

DETAILED DESCRIPTION OF THE INVENTION

The present invention is embodied in a method and apparatus for forming a planar layer comprising a dielectric or other material on a semiconductor wafer, base plate for field emission display, or other related microelectronic substrate. An important aspect of the invention is that the planar layer material is engaged with the flat, free-surface of a liquid support material. The planar layer material conforms to the flat liquid surface to form an extremely flat, uniform layer. The planar layer material is then cooled so that it solidifies and bonds to substrate, while the support material is maintained in a liquid state. FIGS. 1–8 illustrate various embodiments of the apparatus and methods, and like reference numbers refer to like parts throughout the figures.

Figure 1:
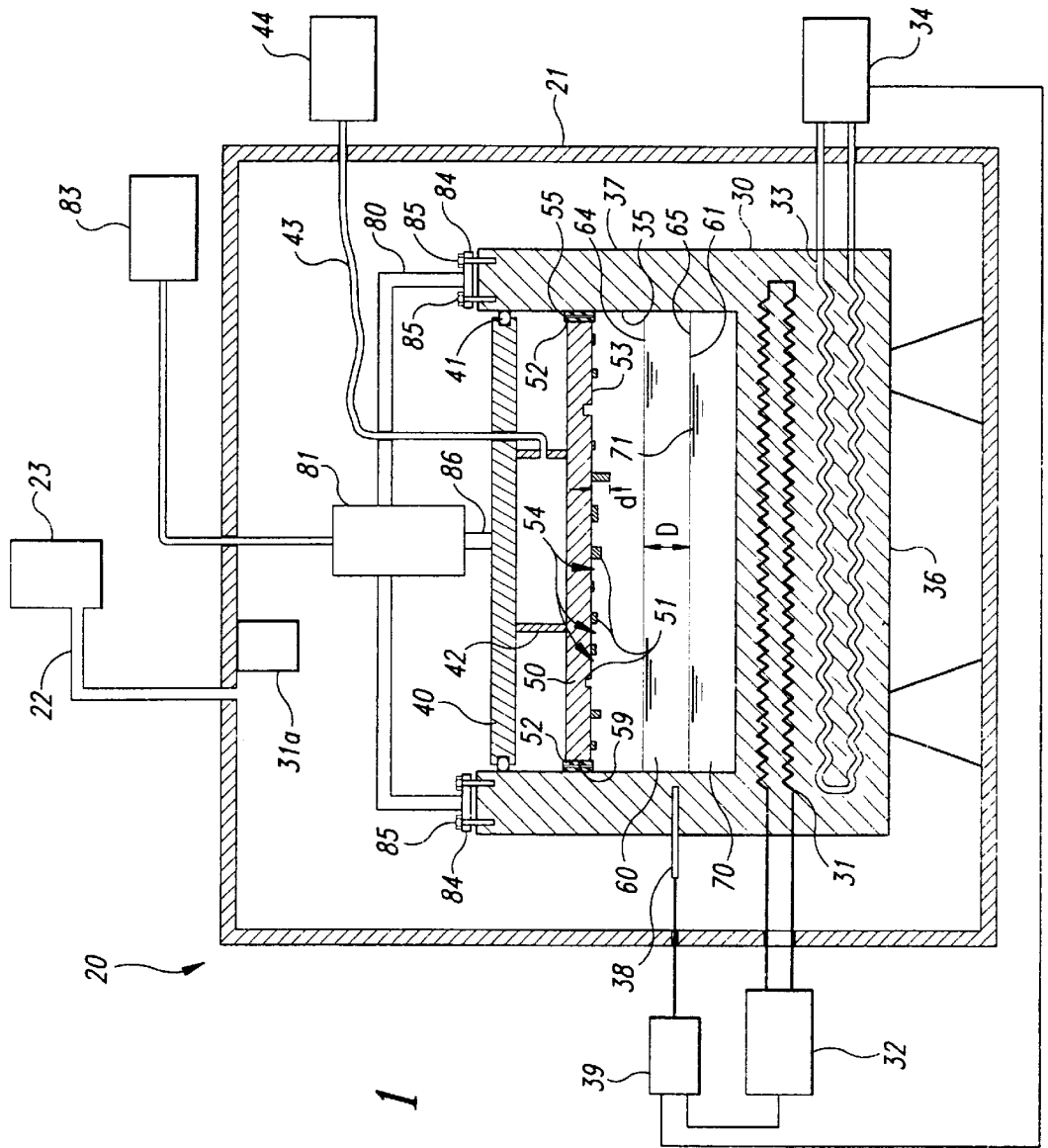
FIG. 1 is a partial cross-sectional view of an embodiment of an apparatus in accordance with the invention to form a planar layer on a substrate.

FIG. 1 is a partial cross-sectional view of one embodiment of a lanar layer apparatus 20. The planar layer apparatus 20 generally has a vessel 30 containing a quantity of liquid support material 70. The planar layer material 60 is positioned upon the support material 70 within the vessel 30. An enclosure 21 surrounds the vessel 30 to reduce heat transfer from the vessel and provide a clean, low-pressure environment within which to form the planar layer.

The vessel 30 comprises a vessel base 36 and sidewalls 37 which project upwardly therefrom. In a preferred embodiment, the base 36 and sidewalls 37 comprise thermally conductive materials and are sufficiently thin to be quickly heated and cooled. A conductive heating device 31 is positioned within the base 36 and is connected to an electrical power source 32 with leads in a conventional manner. When activated, the heating device 31 conductively heats the base 36 and sidewalls 37 of the vessel 30 and the support material 70 contained therein. The support material 70 and sidewalls 37 conductively heat a quantity of the planar layer material 60 positioned upon the support material.

The vessel 30 further comprises a cooling element 33, also positioned within the base 36. The cooling element 33 is coupled to a cooling source 34 which provides refrigerated liquid or gas to cool the support vessel 30 and its contents, bonding or adhering the planar layer material 60 to a substrate 50, as will be discussed in greater detail below.

In a preferred embodiment, a temperature sensor 38 is positioned within the sidewall 37 of the vessel 30 to monitor the temperature of the vessel or its contents. In one embodiment, the temperature sensor 38 comprises a thermocouple device. Other known devices, including an infrared sensor, are used in other embodiments. The temperature sensor may be positioned to measure an input temperature of the vessel sidewall 37 as shown in FIG. 1, or alternatively may be positioned to directly measure an input temperature of the support material 70 or the planar layer material 60. A thermostat 39 is preferably coupled to the temperature sensor 38 and to both the electrical power source 32 and the cooling source 34 in a conventional manner to receive an input temperature signal from the temperature sensor and automatically control the temperature of the vessel 30 and the support material 70 and planar layer material 60 contained therein. The thermostat 39 may generate an output signal based on the input signal and a proportional, proportional integrative or proportional integrative derivative gain. Other control means may be used in other embodiments.

As shown in FIG. 1, the cooling element 33 comprises a conventional refrigerated coil and the heating device 31 comprises a conventional resistance heater, both positioned within the base 36 of the vessel 30. In alternate embodiments, the heating device 31 and cooling device 33 may be positioned in other portions of the vessel 30. In a further alternate embodiment, the heating device comprises an infrared heat source 31a positioned external to the vessel 30 and coupled to a power source with leads (not shown). When activated, the infrared heat source 31a heats the vessel 30 and its contents to a desired temperature and when deactivated, allows the vessel and its contents to cool. In other alternate embodiments, the cooling element 33 and heating device 31 may comprise other devices which quickly heat and cool the support material 70 and the planar layer material 60.

The support material 70 forms a liquid pool having a flat free-surface 71 when the support material is heated to a temperature above its melting point. The support material 70 and vessel 30 then conductively heat the planar layer material 60 to a temperature exceeding the annealing temperature of the planar layer material, causing the planar layer material to soften and form an interface 65 between the planar layer material and the support material. At the interface 65, the planar layer material 60 forms a flat planar surface 61 which corresponds to the flat free-surface 71 of the support material 70. The planar layer material 60 forms an exposed surface 64 opposite the planar surface 61. The planar layer material 60 preferably has a density less than that of the support material 70 so that it floats upon the free-surface 71 of the support material, rather than sinking to the bottom of the vessel 30. The free-surface 71 of the support material 70 accordingly supports the planar layer material 60 and flattens the planar surface 61. The density difference between the two materials is preferably sufficiently large to create a clearly distinct interface 65 therebetween. A distinct interface 65 makes it easier to establish a desired depth D of the planar layer material 60 and therefore the thickness of the resulting planar layer formed on the substrate 50. A distinct interface is also desirable because it reduces the likelihood that the support material 70 will mix with and contaminate the planar layer material 60.

In a preferred embodiment, the support material 70 is heated to a temperature below the boiling point of the planar layer material 60, to prevent the planar layer material from boiling off. It is desirable to prevent the planar layer material 60 from boiling off, both to conserve the quantity of planar layer material used to form the planar layer and to prevent bubbles from forming in the planar layer material which may create discontinuities in the structural and electrical characteristics thereof.

In a further preferred embodiment, the support material 70 is heated to a temperature which is less than its boiling temperature and greater than the annealing temperature of the planar layer material. Accordingly, the support material 70 may heat the planar layer material 60 to its annealing temperature without causing the support material to boil, which may both disturb the flat free-surface 71 and create vapors which infuse the planar layer material with bubbles.

In a further preferred embodiment, the quantity of support material 70 and the size of the vessel 30 are selected to produce a very thin pool of support material in the bottom of the vessel. The thin pool of support material 70 heats and cools quickly, reducing the amount of time required to heat and cool the planar layer material 60. The thin pool of support material 70 is also less likely to form waves in the vessel 30 and is accordingly more likely to form a flat free-surface 71 and a correspondingly flat planar surface 61 of the planar layer material 60.

In a preferred embodiment, the support material 70 is selected from gallium, tin and aluminum, though other materials are used in alternate embodiments. The planar layer material 60 is preferably selected from undoped silicon dioxide or doped materials including tetraethylorthosilicate (TEOS) and borophosphate silicon glass (BPSG). Other materials are used in other embodiments. Obviously, the planar layer material 60 must also be selected so that when heated to at least its annealing temperature, it does not damage the substrate 50 to which it is bonded.

The planar layer material 60 is bonded to the substrate 50 by at least partially immersing the substrate in the planar layer material and then cooling the planar layer material. The substrate 50 is forced into contact with the exposed surface 64 of the planar layer material 60 by a movable piston 40.

In one embodiment, the piston 40 releasably engages the substrate 50 with a vacuum chuck 42. The vacuum chuck 42 is coupled with a vacuum line 43 to a chuck vacuum source 44. The chuck vacuum source 44 may be activated to at least partially evacuate the chuck 42, generating a suction force within the chuck sufficient to releasably attach the substrate 50 thereto. In alternate embodiments, other attachment means known to those skilled in the art may be used to releasably attach the substrate 50 to the piston 40. In one alternate embodiment in which the pressure within the enclosure 21 is reduced to such a level that the vacuum chuck 42 is ineffective, mechanical means such as clamps may be used to releasably attach the substrate 50 to the piston 40.

The piston 40 moves up and down between inner wall portions 35 of the vessel 30. In a preferred embodiment, the piston 40 and vessel 30 have circular cross-sectional shapes, and may have other cross-sectional shapes in alternate embodiments. A piston seal 41 sealably engages both the piston 40 and the vessel inner wall portions 35 in a conventional manner. The piston is driven by a hydraulic actuator 81, which is connected to the piston with an actuator rod 86. The actuator rod is driven in a conventional manner by hydraulic fluid supplied by a hydraulic fluid source 83. In alternate embodiments, other means such as pneumatic actuators or mechanical linkages are used to drive the piston 40.

The piston 40 and hydraulic actuator 81 are supported relative to the vessel 30 by a support bracket 80. In one embodiment, the support bracket 80 includes footings 84 coupled to the vessel 30 with adjustment screws 85. The adjustment screws 85 may be used to align the piston 40 with the vessel inner wall portions 35. When the piston 40 is properly aligned, it tends to move freely within the vessel 30 without binding. Furthermore, by properly aligning the piston 40, the planar surface 61 of the dielectric material may be aligned parallel to a reference surface 53 of the substrate 50, so that the planar layer material will have a uniform thickness over the entire substrate.

The substrate 50 may include a plurality of surface features 51 separated by interstices 54, as shown schematically in FIG. 1. The surface features 51 may comprise structures projecting beyond the reference surface 53 or apertures extending into the reference surface. The surface features project a maximum distance d beyond the reference surface 53. Accordingly, the depth D of the planar layer material 60 is preferably selected to be greater than the distance d so that the planar layer material completely covers the surface features 51 when the substrate 50 engages the dielectric material.

Figure 2:
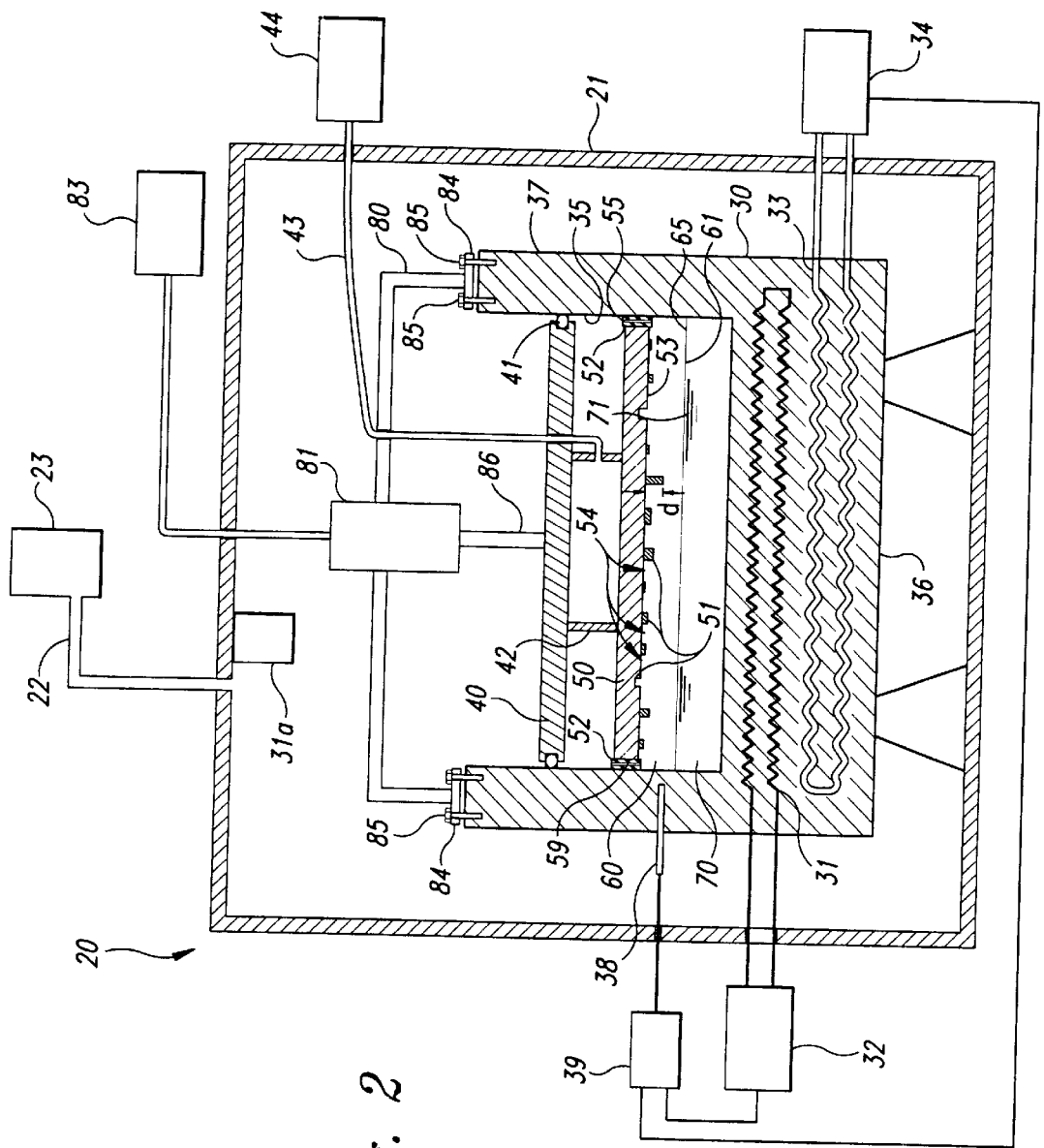
FIG. 2 is a partial cross-sectional view of the apparatus of FIG. 1 with a substrate partially immersed in a planar layer material.

In one embodiment, the substrate 50 is releasably attached to a gasket 52 which sealably engages the perimeter 59 of the substrate and sealably engages the vessel inner wall portions 35. As best seen in FIGS. 1 and 2, the gasket 52 allows the substrate 50 to be forced into contact with the exposed surface 64 at high pressure without allowing the planar layer material 60 to squeeze out between the substrate and the vessel inner wall portions 35. Accordingly, the planar layer material 60 may be forced under pressure into the interstices 54 between the surface features 51, thus increasing the likelihood that the planar layer material will completely and uniformly cover the substrate 50 and the surface features 51. The substrate 50 may be subjected to pressures of up to several hundred atmospheres to adequately infuse the planar layer material 60 into the interstices 54. Pressures substantially less than this may be used in alternate embodiments.

The gasket 52 preferably comprises a material such as quartz which has a low affinity for the planar layer material 60, so that the planar layer material tends to adhere to the substrate 50 rather than to the gasket 52. In an embodiment shown in FIGS. 1 and 2, the gasket 52 is flush with the reference surface 53 and includes gas relief passages 55 which allow gases trapped between the substrate 50 and the planar layer material 60 escape rather than create bubbles in the planar layer material. The relief passages are preferably sufficiently large to permit gases to pass therethrough, and sufficiently small to substantially prevent the planar layer material 60 from passing therethrough. In a preferred embodiment, a vacuum source 23 is coupled with a vacuum line 22 to the enclosure 21 to remove gas from within the enclosure and more particularly to remove gas from the interstices 54, further increasing the penetration of the planar layer material 60 in to the interstices.

Operation of the planar layer apparatus 20 is best understood with reference to FIGS. 1 and 2. The substrate 50 is initially elevated above the vessel 30 with the hydraulic actuator 81. The vacuum source 23 is activated to remove gas from within the low-pressure enclosure 21 and particularly from the interstices 54 between the surface features 51 of the substrate 50. The support material 70 is heated by activating the heating device 31 until the support material attains a liquid state and the planar layer material 60 is at or above its annealing temperature and forms a flat interface 65 between the planar layer material and the support material. The hydraulic actuator 81 then drives the substrate 50 downward directly into the planar layer material 60. When the substrate 50 has been forced with a desired pressure into the planar layer material 60, the support material 70 and planar layer material 60 are cooled by passing cooling liquid or gas through the cooling element 33. As the planar layer material 60 cools, it bonds to the substrate 50. In a preferred method of operation, the support material 70 is not cooled below its melting point to reduce any tendency of the support material to solidify and bond to the planar layer material 60. The hydraulic actuator 81 is then activated to withdraw the substrate 50 from the support vessel 30, and the substrate 50 is removed from the support piston 40. The result of this operation is a substrate 50 having an extremely flat layer of planar layer material 60 attached thereto.

In an alternate method of operation, the planar layer apparatus 20 may be rotated 180° from the orientation shown in FIGS. 1 and 2 to an inverted position so that the surface features 51 of the substrate 50 face upward. The piston 40 with the substrate 50 attached thereto is positioned within the vessel 30 so as to leave a space between the substrate and the base 36. The planar layer material 60 is then introduced through a hole (not shown) in the base 36 to partially fill the space. The support material 70 is then introduced on top of the planar layer material 60. In this alternate method of operation, the support material 70 preferably has a density less than a density of the planar layer material 60 so that it floats on the planar layer material and forms a well-defined interface 65 with the planar layer material. The planar layer material 60 and support material 70 are heated as discussed above. The piston is moved upward to force the substrate 50 into contact with the planar layer material 60, and the planar layer material 60 is cooled, as discussed above. The substrate 50, with an extremely flat layer of planar layer material 60 is then removed from the apparatus 20.

Figure 3:
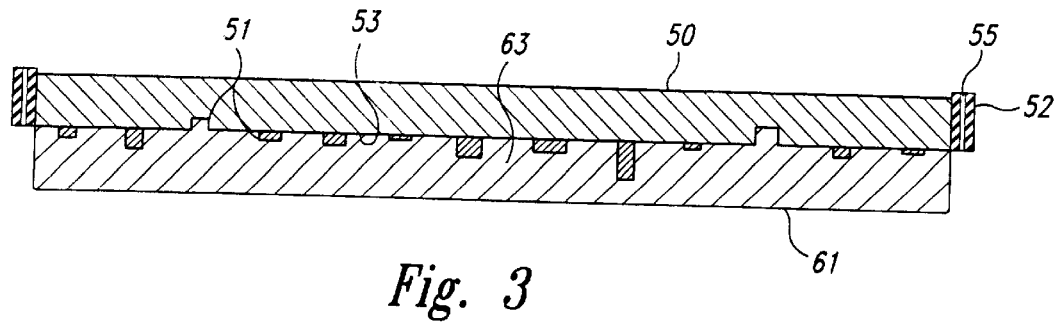
FIG. 3 is partial cross-sectional view of a substrate and planar layer formed using the apparatus of FIG. 1.

FIG. 3 is a partial cross-sectional view of the substrate 50 having a planar layer 63 formed thereon using the method and apparatus 20 described with reference to FIGS. 1 and 2. The planar layer 63 completely covers the surface features 51 and is bonded to the surface features and the reference surface 53, such that the planar surface 61 faces away from the reference surface. Once the substrate 50 has been removed from the apparatus 20, the gasket 52 may be removed and minor post-processing operations may be completed on the substrate 50 and planar layer 63. Post-processing operations may include wet-etching the planar surface 61 with a hydrogen fluoride or buffered hydrogen fluoride solution to remove any residual deposits of support material 70. Alternatively, sputtering, dry etch, or CMP processes known to those skilled in the art may be used to remove any residual deposits. For embodiments in which the substrate 50 is a semiconductor substrate, the post-processing operations may further include cutting the substrate and planar layer 63 to form individual semiconductor wafers, as will be discussed below with reference to FIGS. 4A and 4B.

Figure 4A:
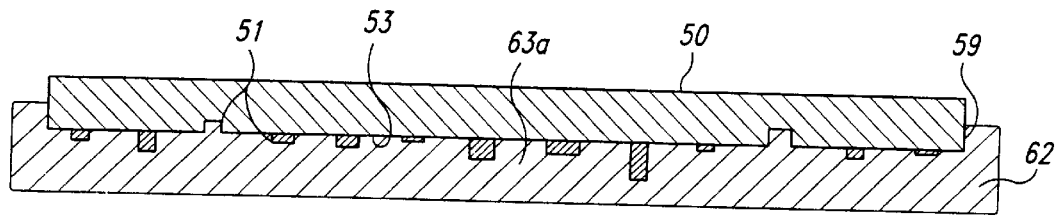
FIG. 4A is a partial cross-sectional view of a substrate and an alternate embodiment of a planar layer formed using the apparatus of FIG. 1.
Figure 4B:
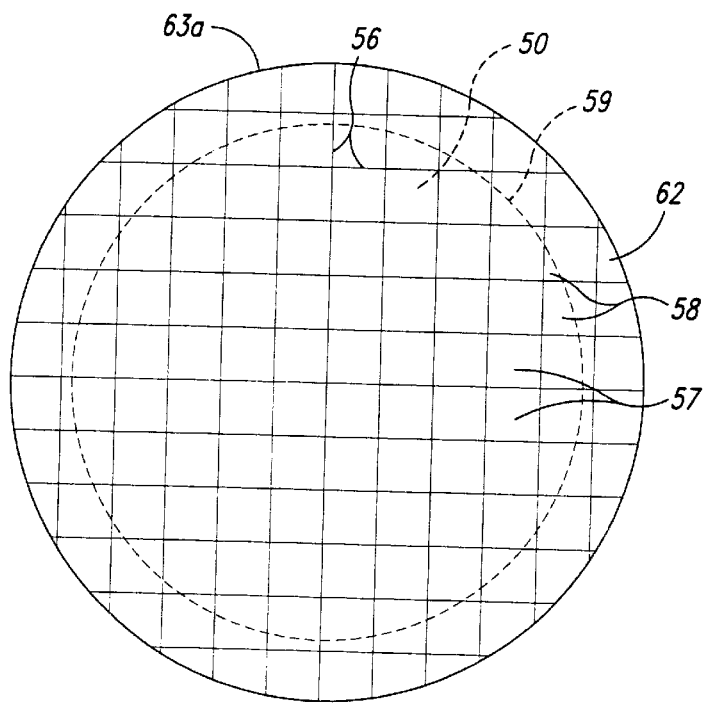
FIG. 4B is a plan view of the substrate and planar layer shown in FIG. 4A.

FIG. 4A is a partial cross-sectional view of the substrate 50 and a planar layer 63a bonded together using an alternate embodiment of the method discussed above with reference to FIGS. 1 and 2. FIG. 4B is a plan view of the substrate and planar layer of FIG. 4A. The alternate method includes engaging the substrate 50 with the planar layer material 60 without first attaching the substrate gasket 52 to the substrate. Accordingly, the planar layer material 60 is free to flow around the perimeter 59 of the substrate 50 to form a ring of excess planar layer material 62 in place of the gasket 52. The excess planar layer material 62 extends between the substrate 50 and the vessel inner wall portion 35 (FIG. 2). This alternate method may be employed where it is not necessary to forcibly engage the substrate 50 with the planar layer material 60 under high pressure.

In a post-processing operation, the substrate 50 and attached planar layer 63a shown in FIG. 4A are cut along cut lines 56 to form individual rectangular semiconductor dies 57 as shown in FIG. 4B. The excess planar layer material 62 and non-uniform wafer portions 58 are removed, leaving the dies 57 intact. If the substrate gasket 52 is used, as discussed above with reference to FIGS. 1–3, the excess planar layer material 62 is eliminated, thereby conserving planar layer material.

An advantage of the planar layer apparatus 20 and method discussed above is that they produce a highly planar layer 63 bonded to a substrate 50. The planar layer 63 may be flatter and more uniform than layers produced using conventional methods such as CMP. Another advantage is that the planar layer 63 is formed on the substrate 50 and made planar in a single step, reducing the number of steps required to produce a finished microelectronic component. Unlike conventional methods, an embodiment of the planar layer apparatus 20 and method discussed above does not require that an inter-level layer be deposited on the substrate 50 prior to forming the planar layer 63. Yet another advantage is that the planar layer is produced quickly. The planar layer material 60 may be heated and cooled in less time than is required to first form the planar layer using conventional techniques and then planarize the planar layer using CMP processes.

In addition, conventional post-CMP processing steps, such as RTP and densification are eliminated. These post-processing steps, which may be required to purify and consolidate the planar layer material, are time-consuming and accordingly increase the time required to produce finished microelectronic components. Furthermore, RTP and densification processes may heat the substrate for an extended period of time, which may cause the substrate to fail and which may also consume a substantial portion of the limited thermal budget available for each substrate. By contrast, an embodiment of the present invention heats the substrate 50 for only a short period of time, reducing the portion of the thermal budget consumed, conserving the thermal budget for use during other processing steps, and reducing the likelihood that the substrate will be damaged.

A further advantage of an embodiment of the planar layer apparatus 20 is that the planar layer material 60 may be applied to the substrate 50 in a clean, low-pressure atmosphere, reducing the potential for contamination of either the planar layer 63 or the substrate 50. By contrast, conventional CMP processes inherently produce particulates and in some applications, liquid slurry, which may contaminate the substrate and/or the planar layer.

Yet a further advantage of an embodiment of the planar layer apparatus 20 is that it may be used to form planar layers 63 comprising undoped planar layer materials 60, such as silicon dioxide, in addition to doped materials such as TEOS and BPSG. Doped materials are used in conventional processes because they flow more easily and accordingly conform more completely to surface features 51 on the substrate 50. However, it is often preferable to use undoped materials because post-processing steps, such as etching, are more easily completed with undoped materials. An embodiment of the present invention conforms even an undoped planar layer material 60 to a surface having highly non-uniform substrate surface features 51 by heating the planar layer material to its annealing temperature and forcing it, under pressure, into contact with the substrate 50. Accordingly, an embodiment of the present invention produces a more conformal planar layer 63 and simplifies post-processing steps such as etching.

Still a further advantage of an embodiment of the planar layer apparatus 20 is that the substrate 50 is engaged by the movable piston 40. Unlike conventional devices which require both a movable piston and a movable substrate support, the single movable piston 40 both engages the substrate 50 and subjects the substrate and planar layer material 62 to a selected pressure, reducing the number of moving parts comprising the apparatus 20.

Figure 5:
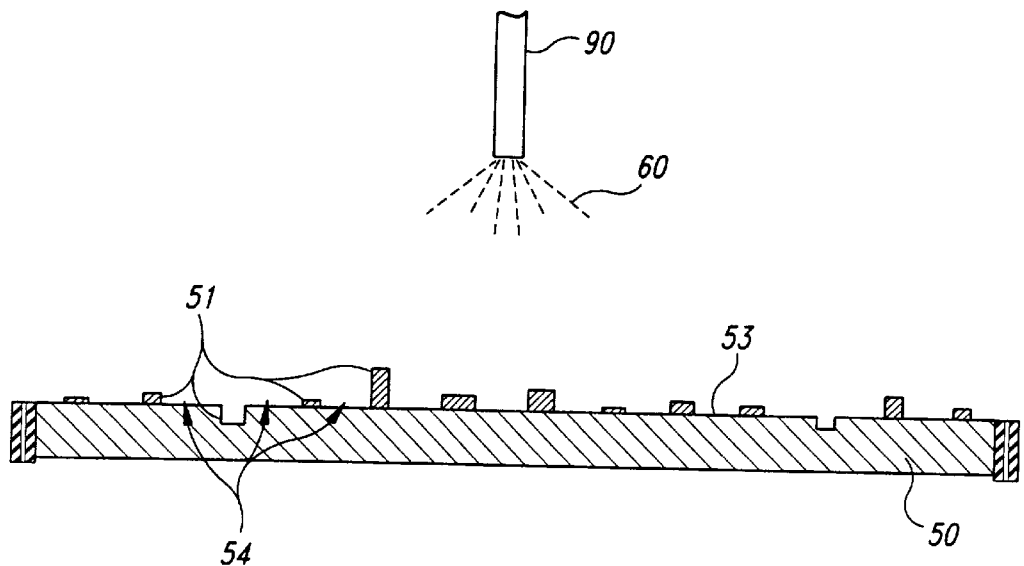
FIG. 5 is a partial cross-sectional view of a vapor deposition apparatus depositing planar layer material on a substrate.
Figure 6:
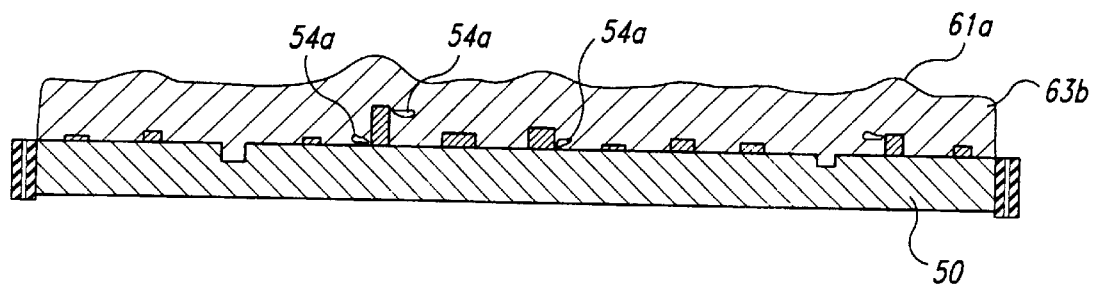
FIG. 6 is a partial cross-sectional view of a substrate and deposition layer formed using the apparatus of FIG. 5.

FIGS. 5–8 illustrate an alternate method for using the planar layer apparatus 20 of FIG. 1 to form a planar layer on a substrate. As shown in FIG. 5, a vapor deposition apparatus 90 is used to deposit the planar layer material 60 directly onto the substrate 50 in a conventional manner. The vapor deposition apparatus 90 progressively thickens an accumulation of planar layer material 60 on the substrate 50 until the planar layer material covers the surface features 51, as shown in FIG. 6. The planar layer material 60 tends to conform roughly to the shapes of the surface features 51, and accordingly forms a deposition layer 63b having an uneven surface 61a opposite the reference surface 53 of the substrate 50. The deposition process may also produce interstices 54a which result from inadequate coverage of the planar layer material, or breaks in the deposition layer 63b.

Figure 7:
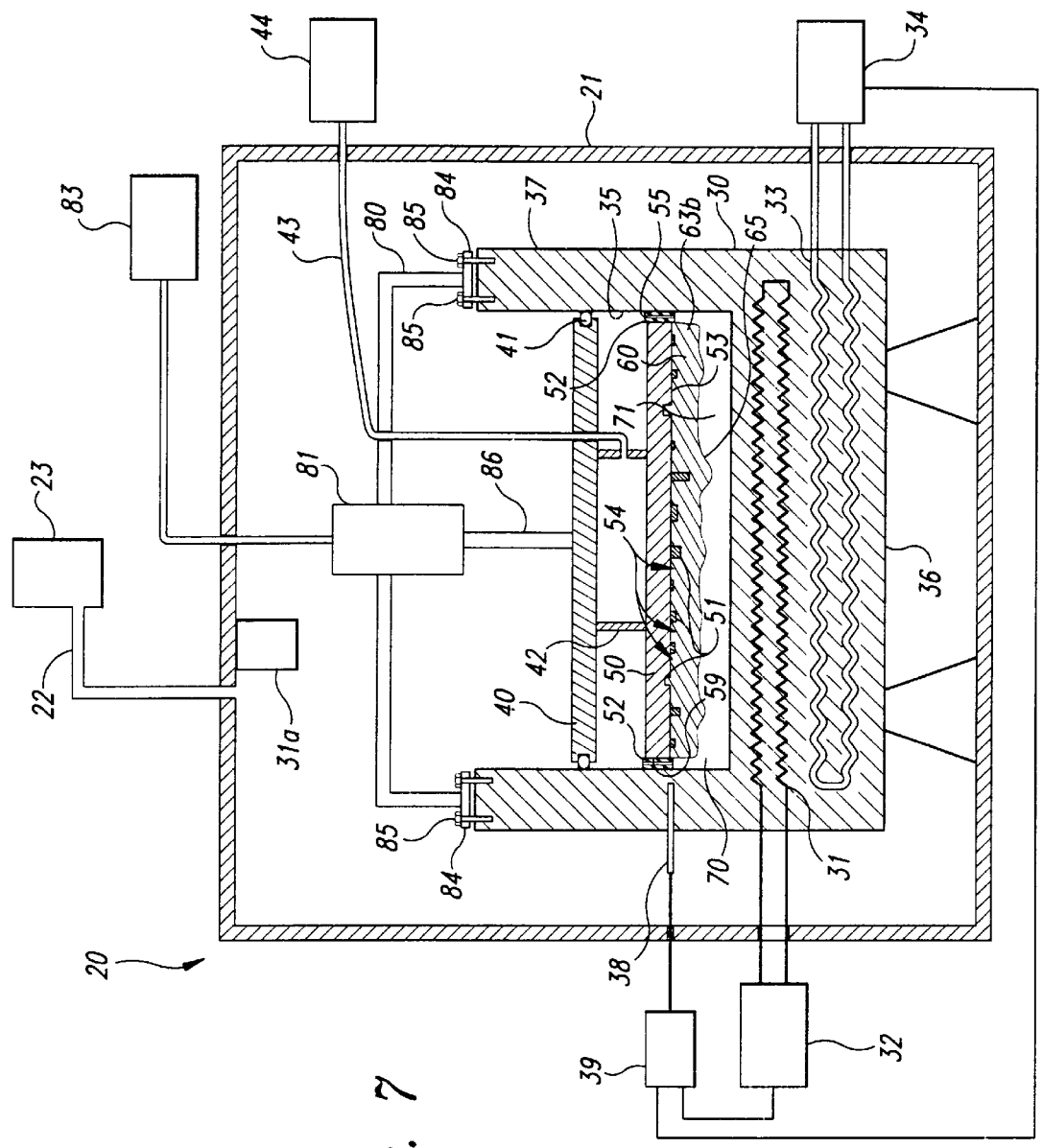
FIG. 7 is a partial cross-sectional view of the apparatus of FIG. 1 positioned to reflow the deposition layer shown in FIG. 6.

FIG. 7 is a partial cross-sectional view of the planar layer apparatus 20 of FIG. 1 shown with the substrate 50 and deposition layer 63b of FIG. 6 installed on the piston 40. The planar layer apparatus 20 is used to reflow the planar layer material 60 comprising the deposition layer 63b, as discussed below.

The vessel 30 shown in FIG. 7 contains a quantity of support material 70 which has been heated and liquefied in substantially the same manner as discussed previously with reference to FIGS. 1 and 2. The planar layer material 60 is heated by the support material 70 and the vessel 30 until it attains a temperature of at least its annealing temperature. The vacuum source 23 is preferably activated to remove gas from within the enclosure 21, reducing the likelihood that gas will be trapped between the deposition layer 63b and the support material 70. The substrate 50 is then forced downward until the deposition layer 63b contacts the support material 70. In a preferred embodiment, the gasket 52 is provided between the substrate 50 and vessel inner walls 35, thereby allowing high pressure to be developed between the deposition layer 63b and the support material 70. The high pressure may accordingly force the dielectric material 60 comprising the deposition layer 63b into the interstices 54a, improving on the results produced by the vapor deposition process described above with reference to FIGS. 5 and 6. In an alternate embodiment, the gasket 52 is not used and the planar layer material may flow between the substrate 50 and the inner wall portions 35, as discussed previously with reference to FIGS. 4A and 4B.

In a preferred embodiment, the support material 70 tends to flow upwardly around the deposition layer 63b to prevent the planar layer material 60 comprising the deposition layer from detaching and flowing away from the substrate 50. In one embodiment, the support material 70 has a density greater than the density of the planar layer material 60 so that if the planar layer material 60 tends to detach from the substrate 50, it will float on the support material 70 and re-adhere to the substrate 50 when cooled, rather than settling to the base of the vessel 30. In an alternate embodiment, the support material 70 may be less dense than the planar layer material 60, so long as the difference in density between the support material and the planar layer material is sufficient to create a clear interface 65 between the two materials. This alternate embodiment is practical where the planar layer material 60 tends not to detach from the substrate 50 when engaged in the support material 70.

Figure 8:
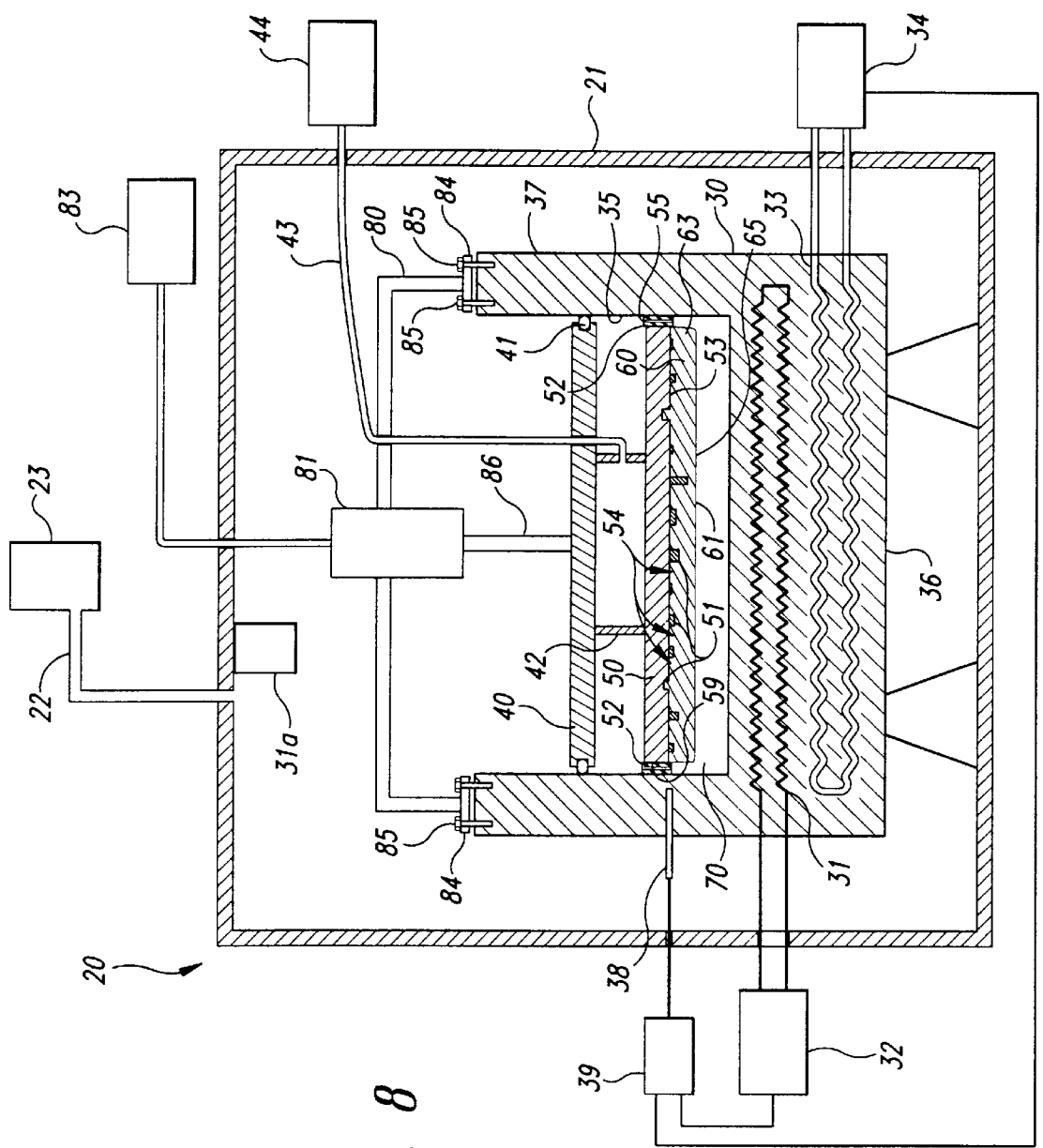
FIG. 8 is a partial cross-sectional view of the apparatus of FIG. 7 with the deposition layer reflowed to form a planar layer.

After engaging the support material 70 for a short period of time, the planar layer material 60 reflows, flattening the uneven surface 61a to form the planar surface 61, as shown in FIG. 8. The uneven deposition layer 63b is accordingly reflowed to form the planar layer 63. Once the planar layer 63 has formed, the support material 70 and planar layer material 60 may be cooled, and the substrate 50 and planar layer material 60 removed from the planar layer apparatus 20, as discussed previously with reference to FIGS. 1 and 2.

In a further alternate embodiment, the apparatus 20 shown in FIGS. 7 and 8 may be rotated 180° to an inverted position such that the surface features 51 of the substrate 50 face upward. Operation of the inverted apparatus 20 is substantially similar to the operation of the inverted apparatus discussed previously with reference to FIGS. 1 and 2, except that the planar layer material 60 is bonded to the substrate 50 in the form of the deposition layer 63b and is therefore not separately introduced into the vessel 30.

An advantage of an embodiment of the planar layer apparatus 20 shown in FIGS. 7 and 8, in addition to the advantages discussed previously with reference to FIGS. 1–4B, is that the apparatus may be used to form a planar surface 61 on an accumulation of planar layer material 60 which has previously been bonded to the substrate 50. Accordingly, a variety of techniques, such as the deposition technique shown in FIGS. 5 and 6, may be used to bond the planar layer material 60 to the substrate 50, without particular regard for the planarity of uneven surface 61a opposite the substrate. The planar layer apparatus 20 may then be relied upon to reflow the planar layer material 60 and form the planar surface 61.

A further advantage of an embodiment of the planar layer apparatus shown in FIGS. 7 and 8 is that pressure may be applied to the deposition layer 63b after it has been bonded to the substrate 50 to force the planar layer material 60 into the interstices 54 between the substrate surface features 51. Accordingly, a variety of methods may be used to bond the planar layer material 60 to the substrate 50 without requiring the planar layer material to completely penetrate the interstices 51, because the planar layer apparatus 20 may be subsequently used to increase the planar layer material penetration into the interstices.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A method for forming a planar layer on a surface of a microelectronic substrate, comprising:

providing a planar layer having a first surface facing the microelectronic substrate and a substantially planar second surface opposite to the first surface; and bonding the first surface of the planar layer directly to the microelectronic substrate;

controlling a temperature of a liquid support material having a density greater than a density of the planar layer to be at least a temperature at which the planar layer softens; and floating the planar layer on the liquid support material so that the planar layer attains a temperature sufficient to soften the planar layer.

2. The method of claim 1 wherein the act of bonding the planar layer comprises:

engaging the first surface of the planar layer with the surface of the microelectronic substrate; and cooling the planar layer to a temperature less than the temperature at which the planar layer softens.

3. The method of claim 1, further comprising heating the liquid support material to a temperature greater than its melting temperature.

4. The method of claim 1, wherein a gas is present in a region proximate to the microelectronic substrate, and wherein the method further comprises removing the gas from the region proximate to the microelectronic substrate to prevent the gas from being trapped between the planar layer and the microelectronic substrate when the planar layer is bonded to the microelectronic substrate.

5. The method of claim 1, further comprising containing the liquid support material and planar layer material a vessel.

6. The method of claim 1, wherein surface features are present on the microelectronic substrate, and wherein the method further comprises pressing the microelectronic substrate into engagement with the planar layer to force a portion of the planar layer between the surface features of the microelectronic substrate.

7. A method for forming a planar layer on a surface of a microelectronic substrate, comprising:

providing a planar layer having a first surface facing the microelectronic substrate and a substantially planar second surface opposite the first surface; and adhering the first surface of the planar layer directly to the microelectronic substrate;

controlling a temperature of a liquid support material having a density less than a density of the planar layer to be at least a temperature at which the planar layer softens; and floating the support material on the planar layer so that the planar layer attains a temperature sufficient to soften the planar layer.

8. A method for forming a planar layer of a dielectric material on a surface of a microelectronic substrate, comprising:

floating a selected quantity of planar layer material on a liquid support material having a density greater than a density of the planar layer material and a temperature sufficient to heat the planar layer material to a temperature at which the planar layer material softens;

engaging the surface of the microelectronic substrate with the planar layer material; and cooling the planar layer material to adhere at least a portion of the planar layer material to the surface of the microelectronic substrate, forming a planar layer on the surface of the microelectronic substrate.

9. The method of claim 8, further comprising heating the support material to a temperature not greater than a boiling temperature of the planar layer material.

10. The method of claim 8, further comprising preventing the temperature of the liquid support material from exceeding its boiling temperature.

11. The method of claim 8, further comprising removing the planar layer material and the microelectronic substrate as a unit from the support material.

12. The method of claim 8 wherein the microelectronic substrate has at least one surface feature projecting a selected distance beyond the surface of the microelectronic substrate, further comprising controlling a depth of the planar layer material floating on the support material to be at least the selected distance.

13. The method of claim 8, further comprising s elect ing the planar layer material from tetra ethyl orthosilicate, silicon dioxide, phosphate silicon glass, and borophosphate silicon glass.

14. The method of claim 8, further comprising selecting the liquid support material from gallium, tin, and aluminum.

15. The method of claim 8 wherein the microelectronic substrate has a plurality of surface features defining interstitial regions containing a gas therebetween, further comprising removing the gas from the interstitial regions to prevent the gas from being trapped between the planar layer material and the microelectronic substrate when the planar layer material is engaged with the microelectronic substrate.

16. The method of claim 15, further comprising pressing the microelectronic substrate into engagement with the planar layer material to force a portion of the planar layer material into the interstitial regions of the microelectronic substrate.

17. The method of claim 8, wherein the planar layer contains residual support material, and wherein the method further comprises removing the residual support material from the planer layer.

18. The method of claim 17 wherein the act of removing residual support material includes a process selected from a wet etch process, a dry etch process, a sputtering process, and a chemical-mechanical planarization process.

19. A method for forming a planar layer of a dielectric material on a surface of a microelectronic substrate, comprising:

providing a liquid support material having a temperature at which the dielectric material softens and a density greater than a density of the dielectric material;

placing the dielectric material on the liquid support material to heat the dielectric material to a temperature sufficient to cause the dielectric material to soften and float the dielectric material on the liquid support material;

pressing the surface of the microelectronic substrate into engagement with the dielectric material;

cooling the dielectric material to adhere at least a portion of the dielectric material to the microelectronic substrate while maintaining the liquid support material in a liquid state; and removing the dielectric material and the microelectronic substrate as a unit from the support material.

20. The method of claim 19, further comprising heating the liquid support material to a temperature at which the dielectric material softens and not greater than a boiling temperature of the dielectric material.

21. The method of claim 19 wherein the microelectronic substrate has at least one surface feature projecting a selected distance beyond the surface of the microelectronic substrate, further comprising controlling a depth of the dielectric material floating on the support material to be at least the selected distance.

22. The method of claim 19, further comprising preventing the temperature of the liquid support material from exceeding its boiling temperature.

23. A method for forming a planar layer of dielectric material on a surface of a microelectronic substrate, comprising:

heating a support material to a temperature that exceeds its melting temperature and exceeds a temperature at which the dielectric material softens to form a substantially flat free-surface of the support material;

floating the dielectric material on the free-surface of the support material to form a substantially flat lower surface of the dielectric material adjacent the free-surface of the support material, and an upper surface opposite the lower surface;

engaging the surface of the microelectronic substrate with the upper surface of the dielectric material;

cooling the dielectric material to adhere the dielectric material to the microelectronic substrate; and removing the dielectric material and the microelectronic substrate as a unit from the support material.

24. The method of claim 23 wherein the act of heating the support material includes irradiating the support material with infrared radiation.

25. The method of claim 2 wherein the act of heating the support material includes conductively heating a vessel containing the support material.

26. The method of claim 23 Wherein the act of cooling the dielectric material includes conductively cooling a vessel containing the support material.

27. The method of claim 23, further comprising heating the support material to a temperature less than a boiling temperature of the dielectric material.

28. The method of claim 23, further comprising preventing the temperature of the support material from exceeding its boiling temperature.

29. A method for forming a planar layer of dielectric material on a surface of a microelectronic substrate, the method comprising:

controlling a temperature of a support material to be greater than its melting temperature, less than its boiling temperature and greater than a temperature at which the dielectric material softens to form a substantially flat free-surface of the support material;

placing the dielectric material on the free-surface of the support material to heat the dielectric material and form a layer of dielectric material having a substantially flat lower surface conforming to the free-surface of the float material;

engaging the surface of the substrate with the dielectric material layer; and cooling the dielectric material layer to bond the dielectric material layer to the substrate.

30. The method of claim 29 wherein the act of controlling the temperature of the support material includes irradiating the support material with infrared radiation.

31. The method of claim 29 wherein the act of controlling the temperature of the support material includes conductively heating a vessel containing the support material.

32. The method of claim 29 wherein the act of controlling the temperature of the support material includes measuring an input temperature of the support material and adjusting the temperature of the support material based on the input temperature.

33. The method of claim 29 wherein the act of controlling the temperature of the support material includes measuring an input temperature of a vessel containing the support material and adjusting the temperature of the support material based on the input temperature.

34. The method of claim 29 wherein the act of controlling the temperature of the support material includes measuring an input temperature of the dielectric material and adjusting the temperature of the support material based on the input temperature.

35. The method of claim 29 wherein the act of cooling the dielectric material layer includes conductively cooling a vessel containing the dielectric material layer.

36. The method of claim 29, further comprising heating the support material to a temperature not greater than a boiling temperature of the dielectric material.

37. The method of claim 29 Wherein the microelectronic substrate has at least one surface feature projecting a selected distance beyond the surface thereof, further comprising controlling a depth of the dielectric layer to be at least the selected distance.

38. A method for forming a planar layer of a selected material on a microelectronic substrate, the method comprising:

bonding the selected material to a surface of the microelectronic substrate;

engaging the selected material with a liquid support material having a density different than a density of the selected material and having a temperature of at least a temperature sufficient to heat at least a portion of the selected material to a temperature at which the selected material softens; and cooling the selected material to a temperature below the annealing temperature of the selected material.

39. The method of claim 38, further comprising selecting the liquid support material to have a density greater than a density of the selected material.

40. The method of claim 38, further comprising select i ng the liquid support material to have a density less than a density of the selected material.

41. A method for forming a planar layer of a selected material on a microelectronic substrate, the method comprising:

adhering the selected material directly to a surface of the microelectronic substrate, the selected material having a first surface adjacent the microelectronic substrate and a second surface opposite the first;

controlling a temperature of a liquid support material to be at least a temperature at which the selected material softens, the liquid support material having a substantially flat free-surface and a density different than a density of the selected material; and engaging the second surface of the selected material with the liquid support material so that at least a portion of the selected material attains a temperature at which the selected material softens; and cooling the selected material to a temperature below a temperature at which the selected material softens.

42. The method of claim 41, further comprising selecting the liquid support material to have a density greater than a density of the selected material.

43. The method of claim 41, further comprising selecting the liquid support material to have a density less than a density of the selected material.

44. The method of claim 41, further comprising selecting the selected material to be a dielectric material.

45. The method of claim 41, further comprising selecting the selected material from silicon dioxide, tetra ethyl orthosilicate, phosphate silicon glass, and borophosphate silicon glass.

46. The method of claim 41, further comprising selecting the support material from gallium, tin and aluminum.

47. The method of claim 41, further comprising heating the support material.

48. The method of claim 41, further comprising disengaging the selected material and the microelectronic substrate as a unit from the support material.

49. The method of claim 41 wherein the selected material detaches from the microelectronic substrate when the selected material is engaged with the liquid support material and the act of cooling the selected material includes reattaching the selected material to the microelectronic substrate.

50. The method of claim 41 wherein the act of adhering the selected material to the microelectronic substrate includes depositing selected material vapor on the surface of the microelectronic substrate.

51. The method of claim 50 wherein the microelectronic substrate has at least one surface feature projecting a selected distance beyond the surface thereof and the act of depositing the selected material includes progressively depositing the selected material on a portion of the surface spaced apart from the surface feature until the selected material attains a thickness at least equal to the selected distance.

52. The method of claim 41, wherein the act of engaging the selected material with the microelectronic substrate includes preventing the temperature of the selected material from exceeding its boiling temperature.

53. The method of claim 41 wherein the act of controlling the temperature of the liquid support material includes preventing the temperature of the liquid support material from exceeding its boiling point.

54. The method of claim 41, wherein a gas is present in a region adjacent the selected material, and wherein the method further comprises removing the gas from the region adjacent the selected material to prevent the gas from being trapped between the selected material and the liquid support material when the selected material is engaged with the liquid support material.

55. The method of claim 41, further comprising pressing the microelectronic substrate into engagement with the selected material to force a portion of the selected material into interstitial regions of the microelectronic substrate.

56. A method for forming a planar layer of a dielectric material on a microelectronic substrate, the method comprising:

depositing the dielectric material directly on a surface of the microelectronic substrate to form a layer of dielectric material having a first surface bonded to the microelectronic substrate and a second surface opposite the first;

controlling a temperature of a liquid support material having a substantially flat free-surface to be greater than a temperature at which the dielectric material softens;

engaging the second surface of the dielectric material with the liquid support material so that at least a portion of the dielectric material attains a temperature that exceeds the temperature at which the dielectric material softens and conforms to the free-surface;

cooling the first material; and removing the dielectric material layer and substrate as a unit from the support material.

57. The method of claim 56, further comprising selecting the liquid support material to have a density greater than a density of the dielectric material.

58. The method of claim 56, further comprising selecting the liquid support material to have a density less than a density of the dielectric material.

* * * * *

UNITED STATES PATENT AND TRADEMARK OFFICE
CERTIFICATE OF CORRECTION

PATENT NO. : 6,103,638
DATED : August 15, 2000
INVENTOR(S) : Karl M. Robinson

Page 1 of 1

It is certified that error appears in the above-identified patent and that said Letters Patent is hereby corrected as shown below:

Column 12,
Line 30, change "comprising s elect ing" to -- comprising selecting --

Column 13,
Line 43, change "of claim 2 wherein" to -- of claim 23 wherein --

Column 14,
Line 53, change "comprising select i ng" to -- comprising selecting --

Signed and Sealed this

Nineteenth Day of February, 2002

Attest:

Attesting Officer

JAMES E. ROGAN
*Director of the United States Patent and Trademark Office*